United States Patent [19]

Hanamura

[11] Patent Number: 5,749,142
[45] Date of Patent: May 12, 1998

[54] METHOD AND DEVICE FOR ADJUSTING NOZZLE HEIGHT FOR RECOGNITION IN SURFACE MOUNTER

[75] Inventor: Naoki Hanamura, Iwata, Japan

[73] Assignee: Yamaha Hatsudoki Kabushiki Kaisha, Iwata, Japan

[21] Appl. No.: 544,014

[22] Filed: Oct. 17, 1995

[30] Foreign Application Priority Data

Oct. 19, 1994 [JP] Japan .................. 6-253813

[51] Int. Cl.$^6$ .............. H05K 3/30; H05K 13/04; B23Q 17/22; G01B 11/02
[52] U.S. Cl. .............. 29/833; 29/712; 29/743; 29/834; 29/DIG. 44; 294/64.1; 356/375; 356/383; 356/385; 364/468.28; 414/730; 414/737; 414/752; 901/40; 901/46
[58] Field of Search .............. 29/833, 834, 840, 29/709, 740, 712, 743, DIG. 44; 364/468.21, 468.28, 478.01; 294/2, 64.1; 356/375, 383, 384, 385; 414/730, 737, 752; 901/40, 46, 47

[56] References Cited

U.S. PATENT DOCUMENTS

| 4,670,981 | 6/1987 | Kubota et al. ............ 29/834 X |
| 4,805,110 | 2/1989 | Takashashi et al. ........ 29/709 X |
| 5,003,692 | 4/1991 | Izumi et al. ............... 29/834 |
| 5,384,956 | 1/1995 | Sakurai et al. ............. 29/834 |
| 5,608,642 | 3/1997 | Onodera ................... 29/834 X |
| 5,619,328 | 4/1997 | Sakurai ..................... 356/375 |

FOREIGN PATENT DOCUMENTS

| 0582171 | 2/1994 | European Pat. Off. ........ 29/743 |
| 3532500 | 3/1986 | Germany .................... 29/740 |

OTHER PUBLICATIONS

European Search Report dated Jan. 19, 1996.

*Primary Examiner*—Peter Vo
*Attorney, Agent, or Firm*—Knobbe, Martens, Olson & Bear LLP

[57] ABSTRACT

A mechanism and method for mounting components on a substrate in an accurate location. The components are presented in the sensing station at successive positions to determine the optimum position for their determination and this optimum position is preset into the apparatus and all like components are subsequently measured only in that optimum position.

14 Claims, 9 Drawing Sheets

METHOD AND DEVICE FOR ADJUSTING NOZZLE HEIGHT FOR RECOGNITION IN SURFACE MOUNTER

BACKGROUND OF THE INVENTION

This invention relates to a surface mounter and more particularly to an improved apparatus and method for assuring correct positioning of the components by the surface mounter.

There is a wide use for devices that function to pickup small components and position them in an accurate location. Such devices are frequently employed for mounting components on a substrate such as electrical components on a printed circuit board.

Normally these small components are presented to the pickup apparatus in tape-type feeders. Frequently the pickup device employs a vacuum nozzle for attracting and holding the component during its pickup, transportation and positioning. Of course, it cannot be assured that the component will be picked up at an exact location and in an exact orientation.

There have been proposed, therefore, systems whereby the component may be measured by a variety of techniques so that its orientation relative to the pickup head can be calculated or determined. From this calculation or determination, then appropriate corrective factors can be made so that the component will be exactly positioned when it is deposited.

U.S. Pat. No. 5,384,956 issued Jan. 31, 1995 and assigned to the assignee hereof describes a very effective method and apparatus for measuring the orientation of the components and calculating the corrective factors. In accordance with the method and apparatus as shown in that patent, the component is raised into a sensing station where a light source is directed toward the component and its shadow on a receptor is measured in two angular positions by rotating the component in the sensing station. This method and apparatus is extremely effective.

However, many components have a configuration wherein only certain areas of the component are configured and shaped so that measurement may be possible in this or whatever methodology is employed. Thus, it is necessary to ensure that the component will be accurately positioned in the sensing station when it is measured. Many sensing devices utilized for this purpose have a relatively narrow range of effective measurement. Also, from the nature of the component it may be desirable to provide a measurement in only a small area of the component since only that area may be able to provide the necessary information.

Apparatus and methods have been proposed wherein the component is positioned in the station and is measured at a first location. If that measurement is not believed to provide an accurate indication, then the component may be moved slightly and again measured. Such an apparatus is disclosed in the copending application entitled "Component Mounter and Recognition Method," Ser. No. 08/363,682, filed Dec. 23, 1994 now U.S. Pat. No. 5,619,328 in the name of Hiroshi Sakurai, which application is also assigned to the assignee hereof.

Although that method and system is also effective, taking several successive measurements of each component obviously is time consuming.

It is, therefore, a principal object of this invention to provide an improved apparatus and method whereby components may be accurately measured and appropriately positioned in the measuring station.

It is a further object of this invention to provide a method and apparatus wherein the desired pickup position for each component to be measured may be determined and preset in the sensing apparatus.

SUMMARY OF THE INVENTION

This invention is adapted to be embodied in a method and apparatus for measuring a component in a pickup device for assisting in accurate placement of the component. The pickup device comprises a sensing station in which the condition of a component relative to a pickup element of the pickup device is measured.

In accordance with a method for practicing the invention, successive measurements of the condition of the conduit are made at a plurality of spaced positions to each other in a direction perpendicular to the measuring range. These measurements are accumulated and based upon the accumulated information an optimum position for subsequent measurements of like components is set into the apparatus.

In an apparatus for practicing the invention, the pickup device includes means that move the pick up element and a held component to a plurality of positions in the sensing station each spaced slightly from the others. Measurements are taken in each position and those measurements are compiled. From the compiled measurements, an optimum sensing position for the component is calculated and set in a memory of the device so that all like components will be measured at that position.

DETAILED DESCRIPTION OF THE PREFERRED EMBODIMENT OF THE INVENTION

Figure 1:
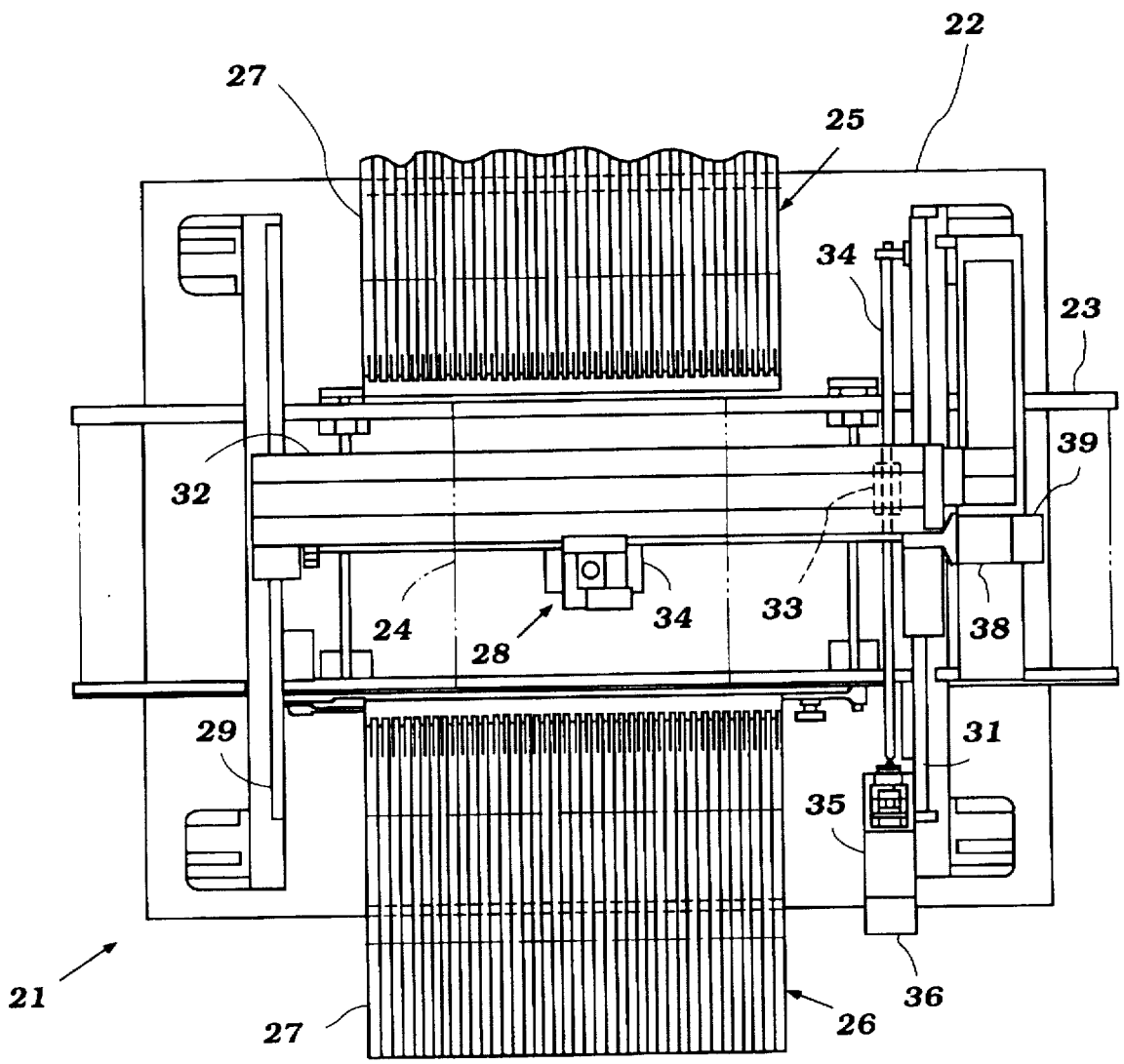
FIG. 1 is a top plan view of a surface mounting apparatus constructed and operated in accordance with an embodiment of the invention.
Figure 2:
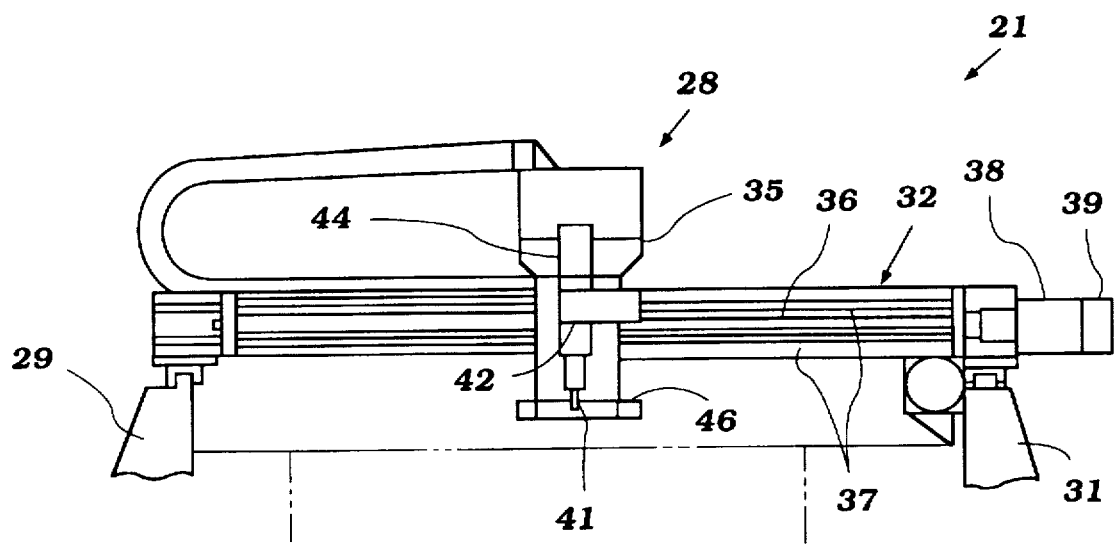
FIG. 2 is an enlarged front elevational view showing the mounting head positioned within the sensing station.
Figure 3:
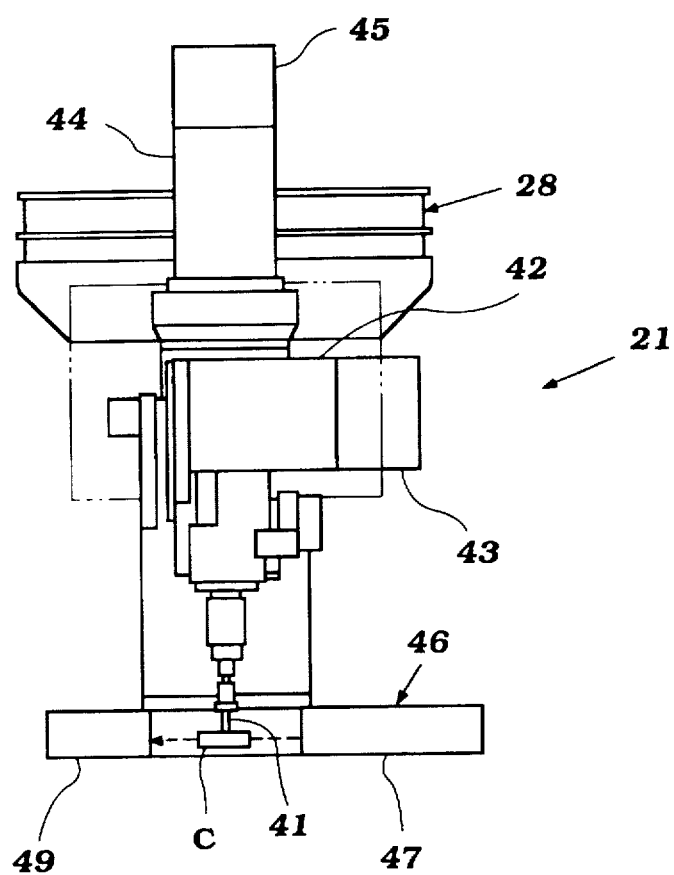
FIG. 3 is a further enlarged view, looking in the same direction as FIG. 2, and shows a component carried by the pickup device and positioned within the sensing station.

Referring now in detail to the drawings and initially primarily to FIGS. 1–3, a surface mounting apparatus constructed and operated in accordance with an embodiment of the invention is identified generally by the reference numeral 21. The mounting apparatus 21 includes a base or table 22 on which a conveyor mechanism 23 is positioned. The conveyor mechanism 23 may be of any known type and selectively moves substrates such as printed circuit boards, one of which is shown in phantom in FIG. 1 and identified generally by the reference numeral 24, to an area between a pair of parts or component feeder stations 25 and 26.

These feeder stations 25 and 26 are disposed on opposite sides of the conveyor mechanism 23 and contain individual parts feeders 27. Each of these parts feeders 27 is of the tape type and presents individual components, which may be of varying types, sizes, and shapes to a pickup head, indicated generally by the reference numeral 28 and which appears in more detail in FIGS. 2 and 3. The construction of the pickup head 28 will be described in more detail later.

A pair of guide rails 29 and 31 are disposed on opposite sides of the feeder stations 25 and 26 and extend in a Y—Y direction. These guide rails 29 and 31 support a carriage assembly 32 by suitable bearings so that the carriage assembly 32 can be moved in the Y—Y direction along the guide rails 29 and 31.

To accomplish this movement, the carriage assembly 32 carries a nut such as a recirculating ball nut 33 which is engaged with a feed screw 34 that is journaled on one side of the guide rail 31. This feed screw 34 is driven by an electric servomotor 35 to which a Y-axis encoder 36 is coupled. The encoder 36 outputs a signal indicative of the number of revolutions of the feed screw 34 and, accordingly, the positioning of the carriage assembly 32 in the Y—Y direction. These components are shown schematically in FIG. 5 and are identified by the same reference numerals therein.

The mounter head 28 has a main body portion 35 which also carries a recirculating ball nut or the like. This recirculating ball nut is engaged with a feed screw 36 which is mounted on the carriage assembly 32 for rotation in a suitable manner. A pair of guide rails 37 are affixed to the carriage assembly 32 on opposite sides of the feed screw 36 and support the mounter head 28 for movement in the X—X axis direction.

Figure 5:
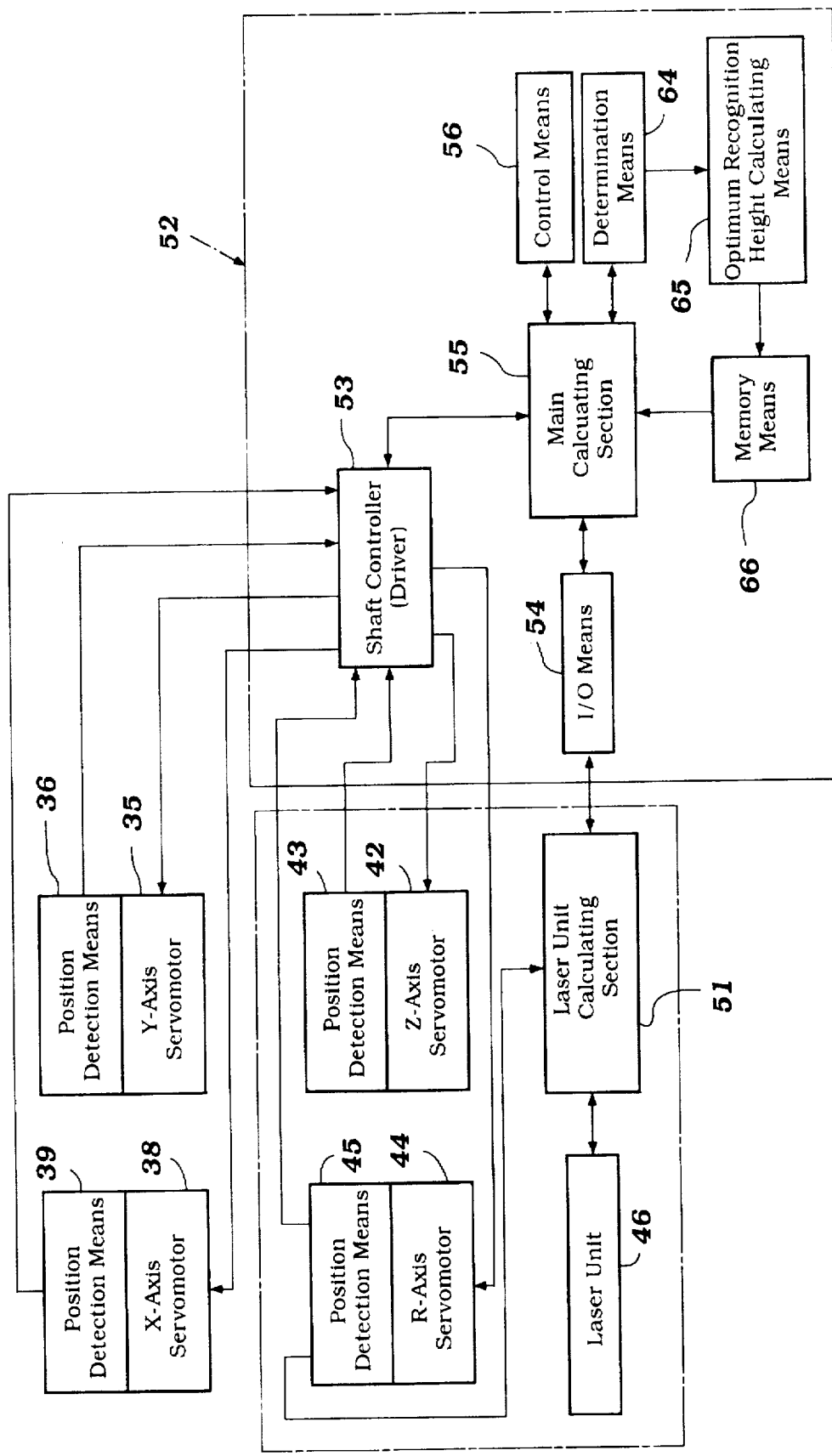
FIG. 5 is a schematic block diagram showing the elements of the component mounting apparatus and their interrelation.

The feed screw 36 is coupled to a servomotor 38 which is effective when operated so as to rotate the feed screw 36 and effect movement of the mounter head 28 in the X—X direction. The servomotor 38 has an X-axis encoder 39 coupled to it. This encoder 39 measures the rotation of the feed screw 36, and, accordingly, the position of the mounter head 28 in the X-axis direction. Again, this interrelationship is also shown in FIG. 5.

From the foregoing description, it should be readily apparent that the movement of the carriage 32 along the guide rails 29 and 31 and of the mounter head 28 relative to the carriage assembly 32 along the guide rails 37 permits movement of the mounter head 28 in the X- and Y-axes to any desired position over the feeder stations 25 and 26 and over the substrate 24.

The body 35 of the mounter head further carries one or more pickup devices, indicated by the reference numeral 41 and which, in a preferred form of the invention, may be of the vacuum type. This permits them to easily pickup small components, such as a component indicated by the reference character C in FIGS. 3 and 4.

The pickup head 41 is mounted for movement in a Z-axis direction on the mounter body 35 in any suitable manner. A suitable servomotor 42 is carried by the mounter head 28 and specifically the body 35 for effecting this movement in the Z-axis direction. An encoder 43 is coupled to the output shaft of the Z-axis servomotor 42 and outputs a signal that is indicative of the position of the pickup nozzle 41 in the Z-axis direction.

Finally, the pickup nozzle 41 is also rotatable in an R-axis which axis is parallel to or coincident with the Z-axis along which the pickup nozzle 41 is moved. Preferably, concentricity is desired. An R-axis servomotor 44 is coupled to the pickup nozzle 41 for this rotational movement. An encoder 45 is connected to the output shaft of the R-axis servomotor 44 and outputs a signal indicative of the rotational position of the pickup nozzle 41 and the component carried thereby.

A sensing device or station, indicated generally by the reference numeral 46, is also carried by the mounter head 28 and specifically its body portion 35. The sensor device 46 is disposed at the lower end of the body portion 35 in proximity to the fully elevated position of the pickup nozzle 41 for a reason which will become apparent.

Figure 4:
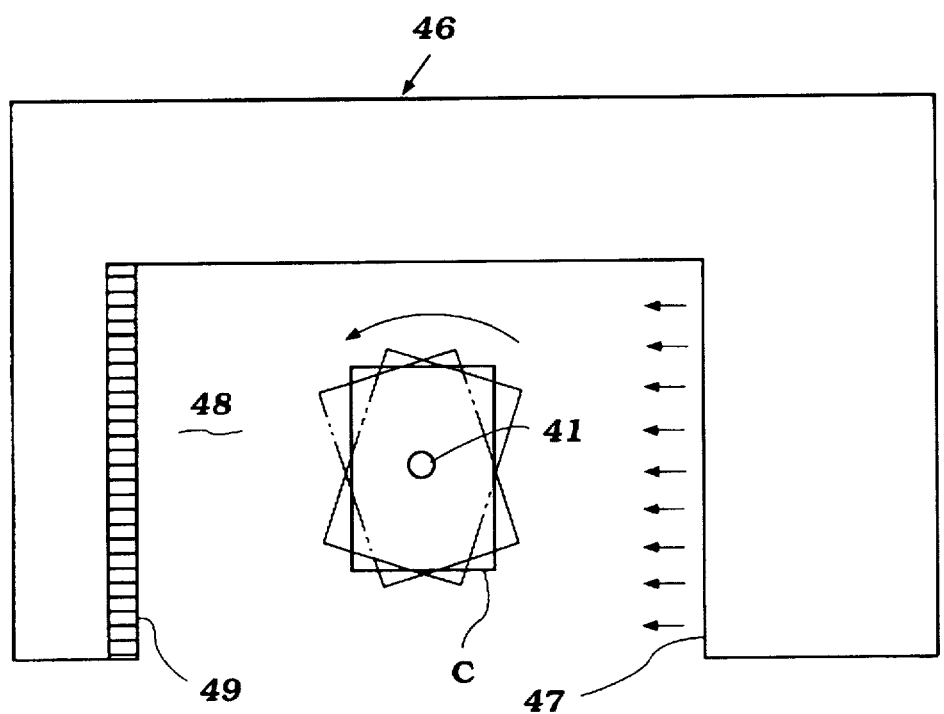
FIG. 4 is a top plan view of the apparatus as shown in FIG. 3 illustrating how the component is measured in the sensing station.

In the illustrated embodiment, the sensor mechanism 46 has a light source portion 47 that is comprised of a laser light source that emits parallel light rays across a gap 48 in which the pickup nozzle portion 41 and held component C is positioned as shown in FIGS. 3 and 4. On the opposite side of the gap 48 from the light source 47, there is provided an array of capacitor coupled devices (CCD) light receptive devices 49.

Thus, the component C will block certain of the light rays and cast a shadow on the CCD device 49 which then outputs this signal to a laser unit calculating section, indicated schematically at 51 in FIG. 5. By rotating the component C in this sensor 46 it is possible to calculate its offset relative to the pickup nozzle 41 in the manner described in the aforenoted U.S. Pat. No. 5,384,956, the disclosure of which is incorporated herein by reference. Although this is the preferred sensing method, other methods may be employed.

To describe generally the method, the component C is initially rotated to a position so that when it is presented into the sensor unit 46 it will not be at either its maximum width (length) condition or at its minimum width (width) position. The component is then rotated through a relative small angle but sufficiently so that the shadow will be either at a minimum dimension or at a maximum dimension during this rotation. From the measurement of the initial angle and the angle through which the component is rotated to its maximum or minimum width condition, it is then possible by way of trigonometric calculations, as set forth in the aforenoted incorporated patent, to calculate the actual offset of the component C relative to the pickup nozzle 41 in the X and Y directions. It is also possible, as noted therein, to determine that the component C is picked up correctly so that it can be properly placed on the printed circuit board or substrate 24.

The total control for the system will now be described by particular reference to FIG. 5, which has been previously referred to and which, as has been noted, is a schematic showing of the components of the system, including those already described.

The system is provided with a main controller, indicated generally by the reference numeral 52 and which includes a shaft driver control 53 that receives and transmits signals to the various servomotors such as the X-axis servomotor 38, the Y-axis servomotor 35, the Z-axis servomotor 42, and the R-axis servomotor 47 so as to manipulate the component C. Basically, the way the device works is that the mounter head 28 is moved to a position in registry with the appropriate feeder section 27 to pickup a specific component. When in registry, the pickup nozzle 41 is lowered to a position to attract the component C by its vacuum force. The pickup nozzle 41 is then elevated and when clear of the pickup station, initial rotation in one direction is accomplished and before the component C is placed in the sensing station 46.

When the component C is in the sensing station 46, during normal measurement, the component will be rotated through the aforenoted angular degree and measurements taken so as to calculate the offset in the X- and Y-axes of the component C for mounting purposes. These calculations may be made while the head 28 is traveling in the X and Y directions toward the location on the substrate 24 where the component C is to be mounted. The control unit 52 receives feedback signals from the various X, Y, Z, and R encoders 39, 36, 43, and 45, respectively, during these operations.

The laser unit 46 and its calculating section 58 exchange data with an input/output means 54 of the controller which, in turn, transmits its signal to a main calculating section 55 which exchanges data with the control means 56 that then controls the shaft driver controller 53 so as to appropriately position the component C.

Figure 6:
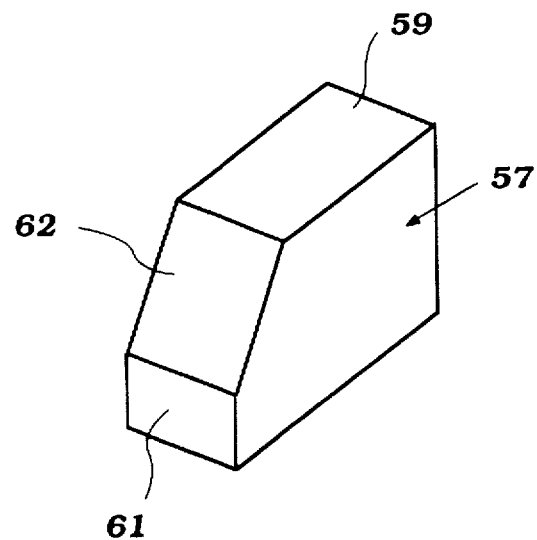
FIG. 6 is a perspective view showing a type of component which is adapted to be handled by the device and one in which the invention has utility because of its configuration.
Figure 7:
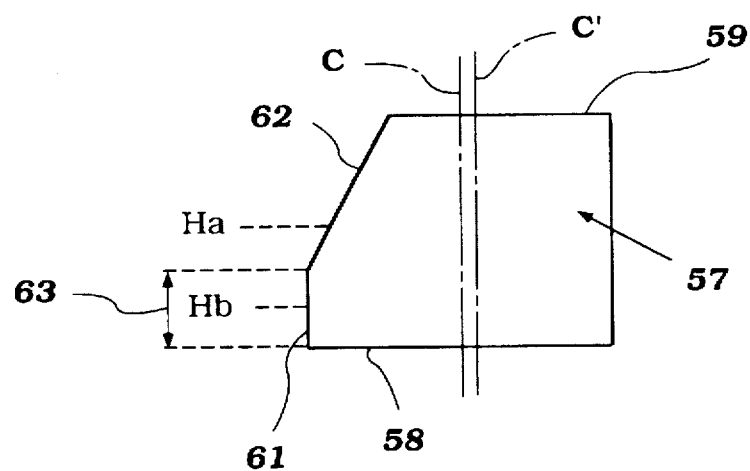
FIG. 7 is a side elevational view of the component.

Many of the types of components which are manipulated with the apparatus 21 may not have a regular shape and thus in order to make the accurate calculations for the correction factors measurement in a specific area of the component is required. FIGS. 6 and 7 show a typical component, indicated generally by the reference numeral 57 which has a configuration that necessitates the practicing of this invention.

As may be seen, the component 57 has a lower surface 58 which is the surface which will be actually positioned on the substrate 24. Opposite the lower surface 58 is an upper surface 59 with which the pickup nozzle 41 cooperates to hold and manipulate the component 57.

Thus, the outer peripheral surface of the component 57 between the surfaces 58 and 59 must be measured to determine the pickup location and the corrective factor required. As may be best seen, the side surface and particular one edge thereof is comprised of a first generally straight, vertically extending section 61. This section 61 has a uniform width along its entire height. Thus a measurement taken at its vertical midpoint Hb will provide accurate measurement of the center of the lower surface 58.

Above this section 61 is an inclined section 62 which has a varying edge surface. Hence, if a measurement is made at a point Ha, the apparent center of the surface 58 would be as indicated at C' in this figure. However, this is not the true center in this plane of the surface 58. The true center is indicated at C. Therefore, it is necessary to measure the width in a range indicated by the dimension 63 where the actual width of the surface 58 can be measured.

The apparatus 21 incorporates a system whereby a component of this type may be tested and the appropriate section for measurement determined and preset so that all subsequent components having the same configuration will be sensed at the proper height in the sensing station 46.

Referring again to FIG. 5, therefore, the control 52 has another series of components that include a determining section 64, an optimum height calculating section 65 and a memory 66 that receives the data from the optimum recognition height calculating means 65 and outputs its signal to the main calculating section 55 so that the component will be appropriately positioned at the proper height within the sensing station 46 before actual measurements are taken. The memory 66 also may store other information in advance such as maximum and/or minimum expected widths of the components and so on.

The way this is done is that when the equipment 21 is initially set up, each type of component expected to be handled is picked up by the pickup nozzle 41 initially rotated and then moved into the sensing section 46 beginning at a lowermost position and then moving gradually upwardly so as to scan progressive areas along the height of the component and take measurements therefrom. These measurements are then fed into the system and the determination section 64 stores data from each measurement indicating whether the measurement was successful in recognizing the component.

A correct measurement is assumed if the measurement is within the range of known measurements for this type of component. That is, and assuming the component is like the components 57 in FIGS. 6 and 7, if the measured dimension is equal to or within a finite range of the known measurement at the height Hb then a successful measurement is determined to have been made. If not, an unsuccessful determination is determined to have been made. This is graphically shown in FIG. 8 wherein the satisfactory calculations are indicated by circles 0 and if not it is indicated by a X.

Figure 8:
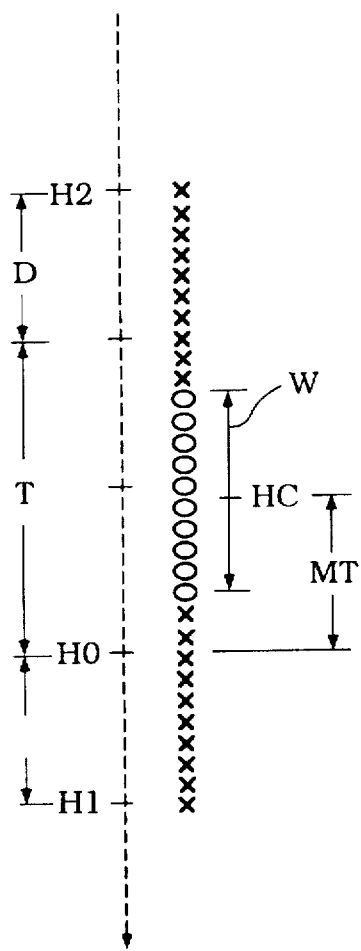
FIG. 8 is a view showing the type of table generated from the data in order to select the final position of the component in the sensing station for the sensing operation.

The actual method of making these determinations will now be described by reference to both FIG. 8 and FIG. 9. In FIG. 8, there is shown the initial starting height H1 at which the pickup nozzle 41 is placed relative to the sensing section 46 and where measurements are begun to be taken. This height H1 is set at a safety factor distance D below the position H0 where the tip of the nozzle 41 is just within the range of the laser section 46. The dimension T is the total height of the component which is being measured. Hence, the pickup nozzle is first moved to the point H1 which is well below the point when the nozzle will be in the station and before the component will be in the station 46 in line with the laser light source. This movement then continues through the height T of the component and for an additional safety factor D thereafter.

Figure 9:
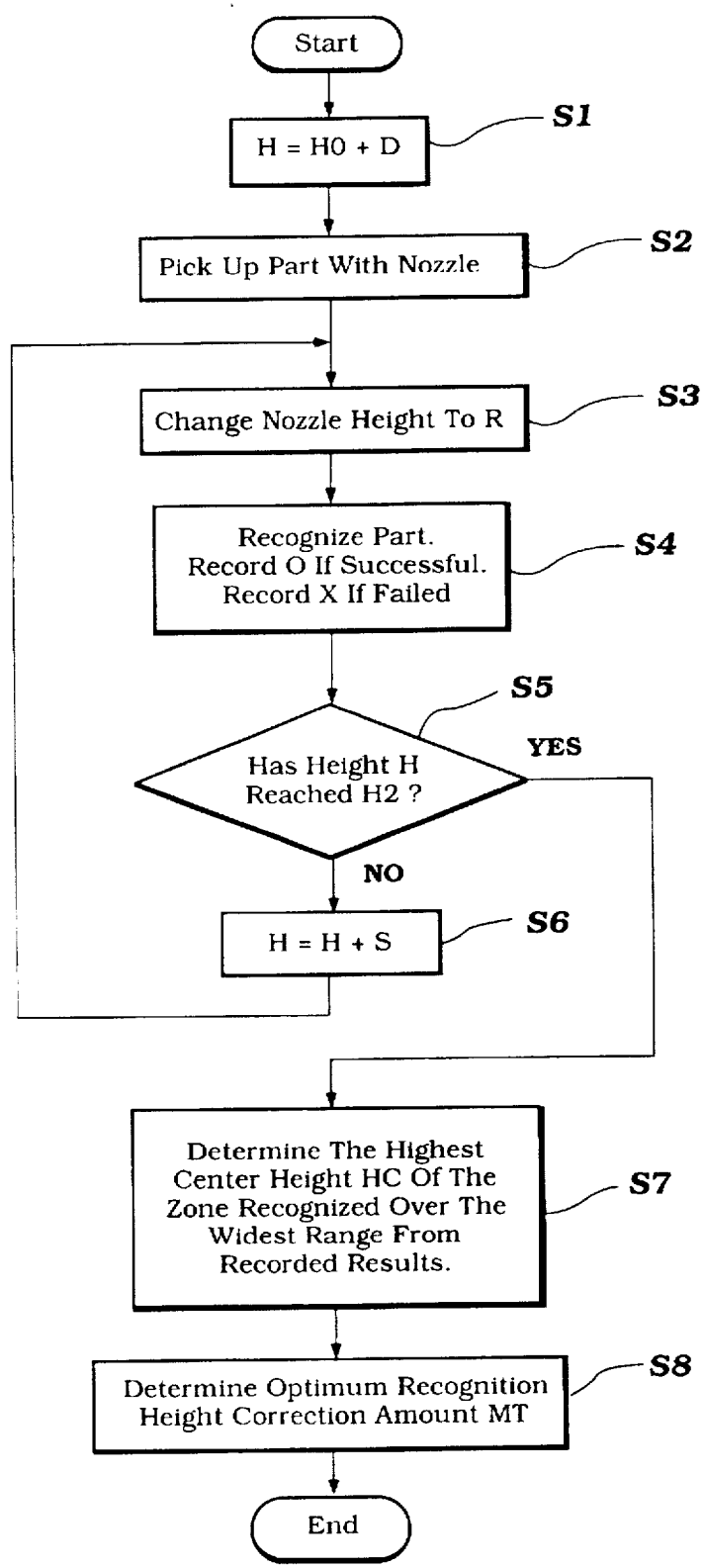
FIG. 9 is a block diagram showing the control routine for utilizing the data from FIG. 8 to arrive at the final preselected position.

Hence and now referring primarily to FIG. 9, the program starts and then moves to the step S1 to set the desired initial sensing position at which a component which has been picked up in which the pickup nozzle will be raise to H=H0+D. This is the position H1. The part is then picked up at the step S2 and the nozzle height is elevated to the position H1 which is set as the new height H at the step S3. A measurement is then taken and the results are transmitted from the calculating section 55 to the determining means 64 to determine if the reading was successful or not.

If it is not successful, the dimension measured is not equal to the known dimension, a failure X is recorded. If it is successful, then this is noted by recording an 0. Thus, at the initial height H1 it will be known that the calculation will not be successful and Xs will be recorded during this and subsequent readings. These recordings are made at the step S4.

After each reading is taken, the program moves to the step S5 to determine if the pickup nozzle has been fully elevated to the height H2. If not, the program moves to the step S6 to set a new height which is the previous height plus the incremental elevation factor S at which the incremental measurements are taken, H=H+S. The program then repeats and continues to take readings until the height H2 is reached.

After the pickup nozzle 41 has been moved through the range of positions H1 to H2, the determining means 64 in cooperation with the optimum height recognizing calculating means 65 searches to find areas where successful measurements have been taken. These being indicated by the dimension W in FIG. 8. It should be noted that there may be more than one area where successful determinations have been made. Where this is the case, the recognizing means selects the area of successful measurements that has the greatest scope. That is, where the dimension W is greatest. This is done at the step S7.

Once this is done, then the program moves to the step S8 to determine the midpoint of the selected successful measurement area or the point HC. The center of this range is taken so as to ensure optimum accuracy and to compensate for individual variations between specific components within the type group. There is then set at the step S8 a correction amount MT indicative of the location of the point HC which is then placed into the memory means 66.

Thus, the machine 21 is then set up so as to accommodate components 57. This set up mode precedes the actual production utilization of the machine and is done for each type of component which is expected to be handled. Thus, when the actual machine is used in production and a component of the type 57 has been utilized, the nozzle 41 is automatically moved to the height MT in the sensing section 46 and measurement taken only at this point. This point MT is easily determined by first determining the point HO and then elevating the nozzle 41 to the point MT, as should be readily apparent.

Figure 10:
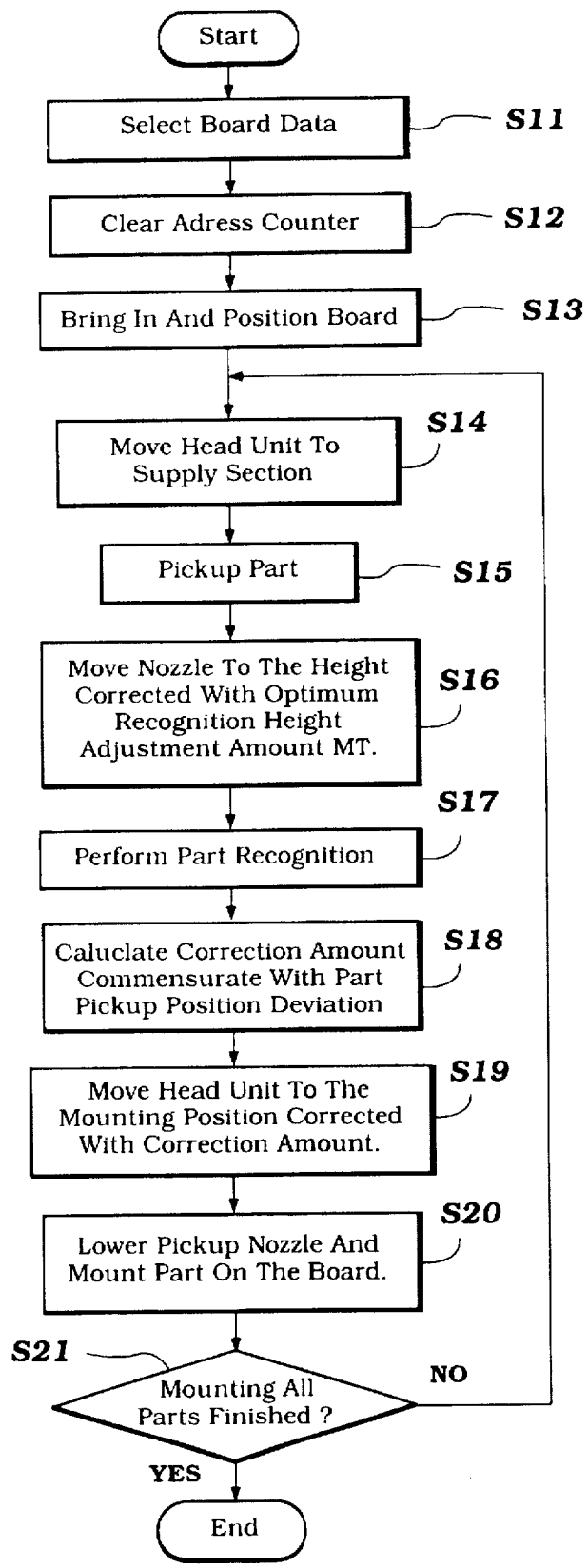
FIG. 10 is a block diagram showing the control routine for finally picking and positioning a component at the correct place on the substrate.

The actual production utilization of the machine 21 is as described in FIG. 10 and this control routine will now be described by reference to that figure. The program starts and moves to the step S11 so as to select which particular circuit board or substrate 24 is to be positioned in the mounting section in registry with the feeder sections 25 and 26 (FIG. 1) and within the range of movement of the mounting head 28.

The program then moves to the step S12 to clear the address counter and moves to the step S13 so that the conveyor 24 is operated to bring the circuit board or substrate 24 into the position shown in phantom lines in FIG. 1.

The program the moves to the step S14 so as to move the mounting head 28 to the appropriate feeder station 27 to pickup the specific component. This pickup occurs at the step S15.

The program then moves to the step S16 so as to elevate the nozzle 41 and held component to the height MT retained in the memory 66 for the specific component which has been picked up. These heights are set in the manner as described previously by references to FIGS. 8 and 9.

The program them moves to the step S17 to perform the parts recognition procedure set forth in aforenoted U.S. Pat. No. 5,384,956 by rotating the component in the sensor station 46 and taking the measurements which are transmitted to the calculating section 55 (FIG. 5).

The correction amount is then made at the step S18 and the mounter head 28 is moved to the corrected position so that the component will be appropriately positioned for its mounting on the circuit board of substrate 24. The program then moves to the step S20 so as to lower the part and mount it on the board.

The program then moves to the step S21 to determine if all parts to be mounted on the board have been mounted and if not, the program repeats back to the step S14 to pickup subsequent components and mount them in accordance with the same procedure described. Once all the mounting has been completed, the program ends.

Therefore, it should be readily apparent from the foregoing description that the described apparatus and method is very effective in permitting the apparatus to be setup so that each component which will be handled by the machine will be positioned at a height in the sensing station 46 where its sensing and the calculation of the corrective factor can be accurately and exactly made. As a result, it is not necessary to take successive measurements during the actual mounting process since these can all be preset by this method into the apparatus.

Of course, it would be readily apparent to those skilled in the art that the method and apparatus described is merely typical of a preferred embodiment of the invention. Various changes and modifications may be made without departing from the spirit and scope of the invention, as defined by the appended claims.

What is claimed is:

1. An apparatus for accurately positioning components on a substrate comprised of a pickup device adapted to pickup said components for subsequent positioning of said components, a sensing station having a finite range of measurement in a first plane, positioning and determining means for moving said pickup device and said component in the direction of said first plane into said sensing station and within said sensing station in successive intervals in the direction of said first plane to successive locations within said sensing station and for taking successive recognitions of components in said sensing station at said successive locations, and means for selecting the optimum successive location position of said components and said pickup device in said sensing station from such measurements and memorizing that data so that subsequent components will be only positioned in that selected optimum successive location position in the sensing station for measurement.

2. An apparatus for accurately positioning components as set forth in claim 1, wherein the components are recognized by rotating them within the sensing station.

3. An apparatus for accurately positioning components as set forth in claim 1, wherein the sensing station is an optical sensing station.

4. An apparatus for accurately positioning components as set forth in claim 3, wherein the optical sensing station comprises a laser light source and a receptor on which a shadow is cast by the component when in the sensing station.

5. An apparatus for accurately positioning components as set forth in claim 1 wherein the successive recognitions comprise measurements and the positioning and determining means compares those measurements with a known value and selects as correct measurements those within a range of the known value to select the optimum position.

6. An apparatus for accurately positioning components as set forth in claim 5 wherein the optimum position is selected as the midpoint of the number of the correct measurements if there is more than one correct measurement determined.

7. An apparatus for accurately positioning components as set forth in claim 6 wherein the apparatus selects the optimum position from the area having the greatest number of correct measurements if there is more than one area where there is at least one correct measurement and those areas of correct measurements are spaced by an area of incorrect measurement.

8. A method for accurately positioning components on a substrate utilizing a pickup device adapted to pickup said components and position said components, a sensing station having a finite range of measurement in a first plane, said method comprising the steps of moving said pickup device and said component in the direction of said first plane into said sensing station and within said sensing station in successive intervals in the direction of said first plane to successive locations within said sensing station, taking successive recognitions of components in said sensing station at the successive locations, selecting the optimum successive location position of said components and said pickup device in said sensing station from such measurements, and memorizing that data so that subsequent components will be only positioned in that optimum successive location position in the sensing station for measurement.

9. A method for accurately positioning components as set forth in claim 8, wherein the components are recognized by rotating them within the sensing station.

10. A method for accurately positioning components as set forth in claim 9, wherein the sensing station is an optical sensing station.

11. A method for accurately positioning components as set forth in claim 10, wherein the optical sensing station comprises a laser light source and a receptor on which a shadow is cast by the component when in the sensing station.

12. A method for accurately positioning components as set forth in claim 8, wherein the successive recognitions comprise measurements and the measurements are compared with a known value and determined to be correct measurements if within a range of the known value to select the optimum position.

13. A method for accurately positioning components as set forth in claim 12 wherein the optimum position is selected as the midpoint of the number of the correct measurements if there is more than one correct measurement determined.

14. A method for accurately positioning components as set forth in claim 13 wherein the optimum position is selected from the area having the greatest number of correct measurements if there is more than one area where there is at least one correct measurement and those areas of correct measurements are spaced by an area of incorrect measurement.

* * * * *

UNITED STATES PATENT AND TRADEMARK OFFICE
CERTIFICATE OF CORRECTION

PATENT NO.   : 5,749,142
DATED        : May 12, 1998
INVENTOR(S)  : Naoki Hanamura It is certified that error appears in the above-identified patent and that said Letters Patent is hereby corrected as shown below:

Column 8,
Line 15, "adapted to pickup" change to -- for picking up one of --
Line 16, "for" change to -- and --
Line 17, "components" change to -- picked up component --
Line 19, insert -- picked up -- before "component"
Line 22, insert -- said finite range of measurement of -- after "within"
Line 24, "components" change to -- the components picked up by said pickup device --
Line 26, "components" change to -- picked up component --
Line 27, "such measurements" change to -- the measurements from said sensing station --
Line 28, insert -- picked up by said pickup device -- after "components"
Line 30, insert -- thereof -- after "measurement"
Lines 31, 34, 37, 42, 48 and 52, "An" change to -- The --
Line 60, "adapted to pickup" change to -- for picking up one of --
Line 61, "position" change to -- positioning --
Line 61, "components" change to -- picked up component --
Line 64, insert -- picked up -- before "component"
Line 65, insert -- said finite range of measurement of -- after "within"

Column 9,
Line 1, "components" change to -- the components picked up by said pickup device --
Line 3, "components" change to -- picked up component --
Lines 4 and 5, "such measurements" change to -- the measurements from said sensing station --
Line 6, insert -- picked up by said pickup device -- after "components"
Line 8, insert -- thereof -- after "measurement"
Lines 9, 12, 15 and 19, "A" change to -- The --

UNITED STATES PATENT AND TRADEMARK OFFICE
CERTIFICATE OF CORRECTION

PATENT NO.   : 5,749,142
DATED        : May 12, 1998
INVENTOR(S)  : Naoki Hanamura It is certified that error appears in the above-identified patent and that said Letters Patent is hereby corrected as shown below:

Column 10,
Lines 5 and 11, "A" change to -- The --

Signed and Sealed this

Ninth Day of September, 2003

JAMES E. ROGAN
*Director of the United States Patent and Trademark Office*